(12) United States Patent  
Radermacher

(10) Patent No.: US 9,541,242 B2
(45) Date of Patent: Jan. 10, 2017

(54) LED LIGHTING ARRANGEMENT

(71) Applicant: KONINKLIJKE PHILIPS N.V., Eindhoven (NL)

(72) Inventor: Harald Josef Guenther Radermacher, Aachen (DE)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 45 days.

(21) Appl. No.: 14/379,760

(22) PCT Filed: Feb. 25, 2013

(86) PCT No.: PCT/IB2013/051500
§ 371 (c)(1),
(2) Date: Aug. 20, 2014

(87) PCT Pub. No.: WO2013/128358
PCT Pub. Date: Sep. 6, 2013

(65) Prior Publication Data
US 2016/0018067 A1 Jan. 21, 2016

Related U.S. Application Data

(60) Provisional application No. 61/605,245, filed on Mar. 1, 2012.

(51) Int. Cl.
*F21V 9/00* (2015.01)
*F21K 99/00* (2016.01)
(Continued)

(52) U.S. Cl.
CPC . *F21K 9/56* (2013.01); *F21K 9/30* (2013.01); *F21K 9/50* (2013.01); *F21K 9/54* (2013.01);
(Continued)

(58) Field of Classification Search
CPC ............ F21K 9/50; F21K 9/56; F21K 9/30; F21K 9/54; H01L 33/50; F21V 9/16; F21V 17/002; F21V 17/101; F21V 23/06
(Continued)

(56) References Cited

U.S. PATENT DOCUMENTS

| | | | |
|---|---|---|---|
| 6,586,874 B1* | 7/2003 | Komoto | G02B 6/0023 257/100 |
| 2002/0167014 A1* | 11/2002 | Schlereth | H01L 33/08 257/79 |
| 2003/0133292 A1* | 7/2003 | Mueller | A45D 42/10 362/231 |
| 2004/0032204 A1 | 2/2004 | Wang et al. | |
| 2004/0119086 A1* | 6/2004 | Yano | H01L 33/50 257/98 |
| 2005/0093430 A1* | 5/2005 | Ibbetson | H01L 33/505 313/501 |
| 2005/0190553 A1 | 9/2005 | Lynch | |
| 2007/0018558 A1* | 1/2007 | Chua | G02B 6/0023 313/485 |
| 2008/0151143 A1* | 6/2008 | Li | G02F 1/133603 349/68 |
| 2008/0232420 A1 | 9/2008 | Brunner et al. | |
| 2008/0315217 A1* | 12/2008 | Van Der Wel | H01L 33/50 257/88 |
| 2009/0050912 A1* | 2/2009 | Chu | H01L 25/0753 257/89 |
| 2010/0118374 A1 | 5/2010 | Quach | |

(Continued)

FOREIGN PATENT DOCUMENTS

CN 102128396 A 7/2011
WO 2008152552 A1 12/2008

*Primary Examiner* — Bryon T Gyllstrom

(57) ABSTRACT

A lighting arrangement (100), comprising a first group of light sources (102) comprising at least one LED providing white light having a first color temperature; a second group of light sources (110) comprising at least one LED providing white light having a second color temperature; and a third group of light sources (116) comprising at least one LED providing a light having a predetermined dominant wavelength; wherein the third group of light sources (116) is configured to receive a light converting device (200, 400) comprising a phosphor (208, 208', 208", 208''', 414), the light converting device (200, 400) configured for converting light from the third group of light sources (116) to white light having a third color temperature, wherein the light converting device (200, 400) is configured to have electrical connection means (120) for providing an electrical connection between one of the first (102) and the second (110) group of light sources and the third group of light sources (116).

10 Claims, 3 Drawing Sheets

(51) Int. Cl.
  *H01L 33/50*   (2010.01)
  *F21V 9/16*    (2006.01)
  *F21V 17/00*   (2006.01)
  *F21V 17/10*   (2006.01)
  *F21V 23/06*   (2006.01)
  *F21Y 101/02*  (2006.01)
  *F21Y 113/00*  (2016.01)

(52) U.S. Cl.
  CPC ............... *F21V 9/16* (2013.01); *F21V 17/002* (2013.01); *F21V 17/101* (2013.01); *F21V 23/06* (2013.01); *H01L 33/50* (2013.01); *F21Y 2101/02* (2013.01); *F21Y 2113/005* (2013.01)

(58) Field of Classification Search
  USPC .................................................. 362/231, 235
  See application file for complete search history.

(56) References Cited

U.S. PATENT DOCUMENTS

| | | | |
|---|---|---|---|
| 2011/0182068 A1 | 7/2011 | Harbers | |
| 2013/0075769 A1* | 3/2013 | Yan | F21K 9/50 |
| | | | 257/89 |
| 2013/0258654 A1* | 10/2013 | Yan | F21V 5/04 |
| | | | 362/231 |

* cited by examiner

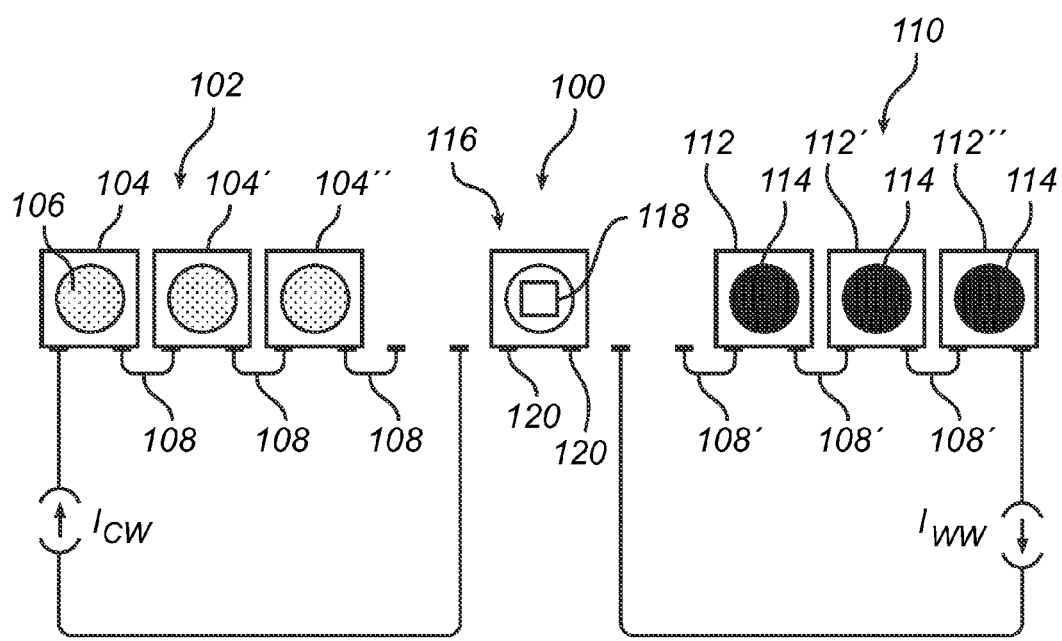
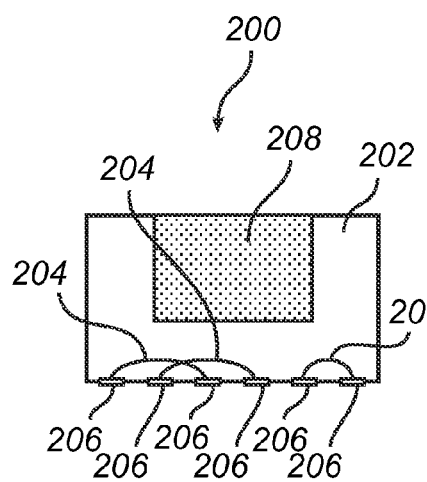
Fig. 2a
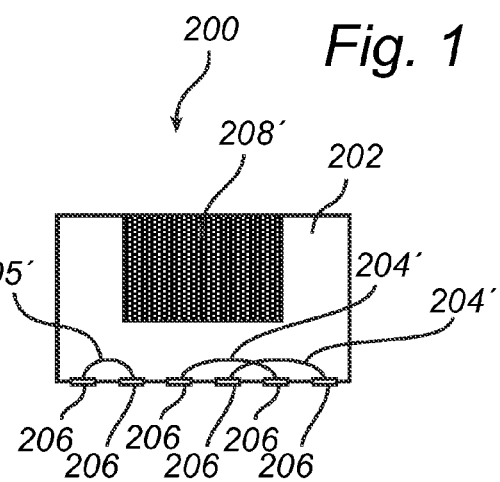
Fig. 2b
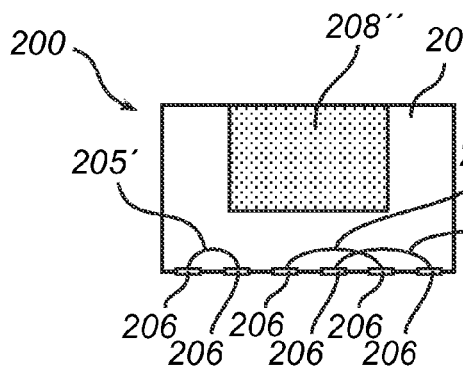
Fig. 2c
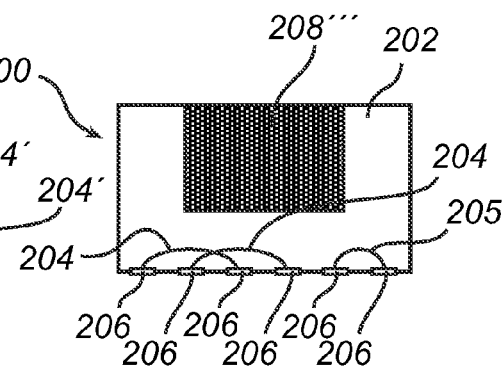
Fig. 2d

LED LIGHTING ARRANGEMENT

CROSS-REFERENCE TO PRIOR APPLICATIONS

This application is the U.S. National Phase application under 35 U.S.C. §371 of International Application No. PCT/IB2013/051500, filed on Feb. 25, 2013, which claims the benefit of U.S. Patent Application No. 61/605,245, filed on Mar. 1, 2012. These applications are hereby incorporated by reference herein.

TECHNICAL FIELD

The present invention relates to the field of light emitting diodes, and more specifically to colour conversion of light emitting diodes.

BACKGROUND OF THE INVENTION

Light emitting diodes, LEDs, are employed in a wide range of lighting applications. LED light sources are, for example, used to produce white light, and different light qualities are required for different applications. For some applications there is a desire to provide white light having a colour temperature of e.g. approximately 2700K, i.e. a warm white light, while for other applications there is a desire to provide white light having a colour temperature of e.g. approximately 6000K, i.e. a cool white light.

In order to provide white light, one approach is to coat blue LED(s) with a phosphor. A fraction of the blue light from the blue LED is thereby being transformed by the phosphor from shorter wavelengths to longer wavelengths, thereby producing so-called phosphor based white LEDs. The characteristics of the white light, e.g. the colour temperature, can be changed or varied by providing different phosphor materials. The white light characteristics may also be varied by providing different thickness and/or coating of the phosphor. Furthermore, in order to provide a white light having a desirable colour temperature, LEDs providing white light of different temperature are often used and mixed with each other. For example, an LED providing a cool white light may be combined and mixed with an LED providing a warmer white light.

Due to the various applications requiring different kind of white light characteristics and inherent variation of performance in relation to manufacturing of semiconductor products, such as LEDs, quite a number of combinations are possible if e.g. a tunable white colour temperature is required. Therefore, a problem with the above mentioned approach of combining LEDs having different white light is that many light modules have to be available for achieving a desired combination.

SUMMARY OF THE INVENTION

It is an object of the present invention to provide an improved lighting arrangement in order to at least partly overcome the above mentioned problems.

According to an aspect of the present invention there is provided a lighting arrangement, comprising a first group of light sources comprising at least one LED providing white light having a first colour temperature, a second group of light sources comprising at least one LED providing white light having a second colour temperature, and a third group of light sources comprising at least one LED providing a light having a predetermined dominant wavelength; wherein the third group of light sources is configured to receive a light converting device comprising a phosphor, the light converting device configured for converting light from the third group of light sources to white light having a third colour temperature, wherein the light converting device is configured to have electrical connection means for providing an electrical connection between one of the first and the second group of light sources and the third group of light sources.

The present invention is based on the insight that the lighting arrangement may be provided with a third group of light sources comprising at least one LED providing light having a predetermined dominant wavelength and configured to receive the light converting device having electrical connection means that may be adaptively connected to one of the first or the second group of light sources. Hereby, the total light emitted by the lighting arrangement may thus be controlled and adjusted based on the specific desired output of white colour temperature from the lighting arrangement, by selectively connecting the third group of light sources to be electrically controlled together and in conjunction with either the first or the second group of light sources. For example, if the mixture of light provided by the first group of light sources is slightly cooler than what is desired, the colour temperature may be adjusted by configuring the third group, using the predetermined dominant wavelength and the light converting device, to provide a warmer white colour temperature, thereby compensating for the slightly cooler colour temperature of the first group of light sources. Hereby, adjustment of the lighting arrangement is thus made possible without having to resort to controlling the third group of light sources separately. Accordingly, in this case the phosphor of the light converting device may be selected such that the third colour temperature is warmer (i.e. lower Kelvin) than the first colour temperature.

The same is of course valid in case of having a first group providing a white colour temperature which is slightly warmer than desired and thereby compensating by configuring the third group of light sources to provide a cooler white colour temperature. Hereby, the total output of white light from the lighting arrangement may be adjusted to fulfil the criteria of desired white light output from the lighting arrangement. An advantage is, at least, that the LEDs of the first and the second group may be selected more freely and possibly be compensated in terms of white colour temperature by means of the third group of light sources.

Furthermore, the present invention is not limited to a specific type and characteristic of the phosphor arranged in the light converting device, i.e. the choice of material, thickness, coating, etc. of the phosphor may be varied depending on e.g. the desired output of white light from the light converting device. Also, each of the first and the second group of light sources may also be equipped with at least one LED arranged with a phosphor in order to provide white light having the first and the second colour temperature. The characteristics of the phosphor may be different for the first and the second group of light sources in order to provide different white colour temperature. Still further, throughout the description the light converting device should be interpreted as forming a part of the lighting arrangement. Moreover, instead of converting the light towards white, the phosphor arranged in the light converting device may also be configured to convert light to a more or less saturated colour, such as e.g. amber.

Preferably, the predetermined dominant wavelength is between 440-460 nm, for example provided by means of a blue light source suitable for phosphor conversion. In an alternative embodiment the light source of the third group provides UV or violet light.

Furthermore, the first and the second group of light sources may comprise a plurality of LED modules. The plurality of LED modules provided in each of the first and the second group of light sources may provide a white light having essentially the same colour temperature or they may provide a white light having slightly different colour temperature so that they in combination with each other provides a white light having a first and a second colour temperature. Moreover, each of the plurality of LED modules may be electrically connected in series to each other and to the electrical connection means of the light converting device. Hereby, an electrical drive current can be provided through each of the LED modules of the first and the second group of light sources and through the light converting device.

The wording "cold white colour temperature" should be interpreted as a white colour having a colour temperature in the range of approximately 3500-7000 Kelvin, while the wording "warm white colour temperature" should be interpreted as a white colour having a colour temperature in the range of approximately 1800-3500 Kelvin.

Furthermore, the light converting device may be provided to the third group of light sources by means of e.g. pressing soldering or gluing.

Moreover, the lighting arrangement is preferably provided as a component of an LED module, wherein the LED module further comprises a light mixing device configured to receive light from the lighting arrangement and to provide a mixed light output. Hereby, the light emitted from the LED module may be mixed so that a desired white colour temperature is provided from the LED module.

Furthermore, the LED module may comprise a control unit for controlling the operation of the first and/or the second group of light sources. Hereby, the control unit may determine and control the mixture of light in order to provide an output white light having a desired colour temperature.

Further features of, and advantages with, the present invention will become apparent when studying the appended claims and the following description. The skilled addressee realize that different features of the present invention may be combined to create embodiments other than those described in the following, without departing from the scope of the present invention.

BRIEF DESCRIPTION OF THE DRAWINGS

These and other aspects of the present invention will now be described in more detail, with reference to the appended drawings showing example embodiments of the invention, wherein:

FIG. 1 illustrates an example embodiment of the lighting arrangement according to the present invention;

FIG. 2a-2d illustrates examples of light converting devices for use with the inventive lighting arrangement;

DETAILED DESCRIPTION

Figure 3A:
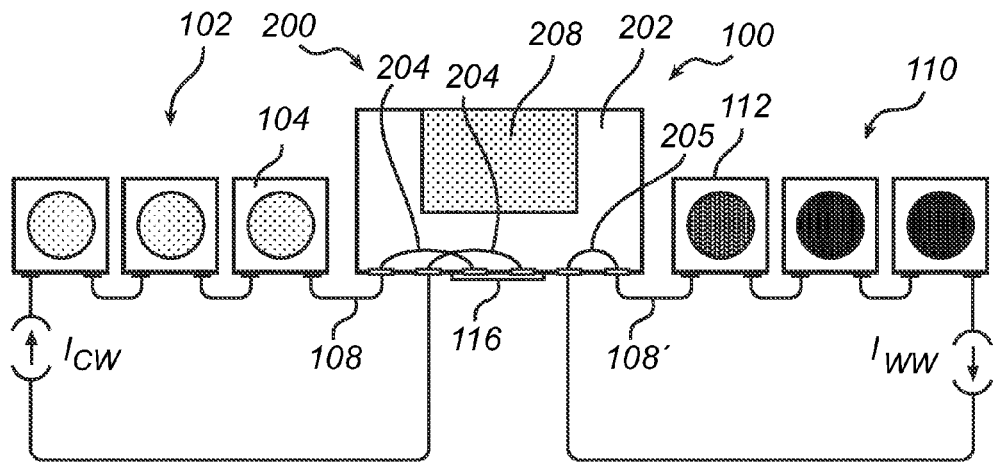
FIG. 3a-3c illustrates exemplified connection schemes of lighting arrangements and light converting devices.

The present invention will now be described more fully hereinafter with reference to the accompanying drawings, in which currently preferred embodiments of the invention are shown. This invention may, however, be embodied in many different forms and should not be construed as limited to the embodiments set forth herein; rather, these embodiments are provided for thoroughness and completeness, and fully convey the scope of the invention to the skilled addressee. Like reference characters refer to like elements throughout.

Referring now to the drawings and to FIG. 1 in particular, there is depicted a lighting arrangement 100 according to a currently preferred embodiment of the invention. The lighting arrangement 100 comprises a first group of light sources 102, in the illustrated embodiment depicted as comprising three light sources 104, 104', 104", where each of the light sources 104, 104', 104" comprises at least one LED and are arranged to provide white light having a first colour temperature. The first colour temperature will in the following and throughout the remaining description be described as a cold white colour temperature, which should be interpreted as a white colour having a colour temperature in the range of approximately 3500-7000 Kelvin. Moreover, the three light sources 104, 104', 104" depicted in FIG. 1 are electrically connected in series with each other by means of electrical wiring 108, e.g. the tracks on a printed circuit board (not shown here), and adapted to be provided with an electrical drive current $I_{CW}$.

Furthermore, the lighting arrangement 100 also comprises a second group of light sources 110, in the illustrated embodiment depicted as three light sources 112, 112', 112", where each of the light sources 112, 112', 112" comprises at least one LED and are arranged to provide white light having a second colour temperature. The second colour temperature will in the following and throughout the remaining description be described as a warm white colour temperature, which should be interpreted as a white colour having a colour temperature in the range of approximately 1800-3500 Kelvin. Moreover, in the same manner as described above in relation to the first group of light sources 102, the three light sources 112, 112', 112" of the second group of light sources 110 are electrically connected in series with each other by means of electrical wiring 108', e.g. the tracks on a printed circuit board (not shown here), and adapted to be provided with an electrical drive current $I_{WW}$.

Still further, the lighting arrangement 100 also comprises a third group of light sources 116. The third group of light sources 116 comprises at least one LED 118 providing a light having a predetermined wavelength, which in the following and throughout the remaining description is an LED configured to provide a blue light having a wavelength in the range of e.g. 440-460 nm. The blue LED 118 is electrically connected to a printed circuit board (not shown here).

Turning to FIGS. 2a-2d, illustrating example embodiments of a light converting device 200 for use with the lighting arrangement 100 according to the present invention. Starting with FIG. 2a, illustrating a first embodiment of the light converting device 200. The light converting device 200 comprises a holder 202, a first 204 and a second 205 set of internal electrical wiring, electrical connecting means 206, and a phosphor 208. Moreover, the light converting device 200 is adapted to be provided to, or combined with, the third group of light sources 116, so that the phosphor 208 arranged in the holder 202 of the light converting device 200 can convert the blue light into a third colour temperature by means of e.g. the selection of phosphor material arranged in the holder 202. Furthermore, the light converting device 200 illustrated in FIG. 2a is adapted to be provided to, or combined with, the third group of light sources 116 for providing a cold white colour temperature. This is achieved by choosing an appropriate phosphor 208 and powering the third group of light sources 116 in combination with the powering of the first group of light sources 102 by electrically connecting the first set 204 of internal electrical wiring to the first group of light sources 102 such that the third group of light sources 116 is electrically driven in series by the electrical drive current $I_{CW}$ of the first group of light sources 102. The second group of light sources 110 is electrically connected to the second set 205 of internal electrical wiring arranged in the light converting device 200 such that the electrical drive current $I_{WW}$ is only provided to the second group of light sources 110, i.e. the second set 205 of internal electrical wiring closes the electrical circuit of the second group of light sources 110. This will be described in more detail in relation to the description of FIG. 3a.

FIG. 2b illustrates another embodiment of the light converting device 200. The light converting device 200 is adapted to be provided to, or combined with, the third group of light sources 116, so that a phosphor 208' arranged in the holder 202 of the light converting device 200 can convert the blue light into a third colour temperature by means of e.g. the selection of phosphor material arranged in the holder 202, as described above in relation to FIG. 2a. The difference between the light converting device illustrated in FIG. 2a and the light converting device illustrated in FIG. 2b is that the first set 204' of internal electrical wiring provides for a connection between the third group of light sources 116 and the second group of light sources 110, such that they together are electrically driven by the electrical drive current $I_{WW}$ of the second group of light sources 110. The second set 205' of internal electrical wiring is hence connected to the first group of light sources 102 such that the electrical drive current $I_{CW}$ is only provided to the first group of light sources 102, i.e. the second set 205' of internal electrical wiring closes the electrical circuit of the first group of light sources 102. Hereby, the light converting device 200 will be powered in conjunction with the second group of light sources 110 and may, when an appropriate phosphor 208' is selected for the light converting device, provide a warm white colour temperature, which will be described in more detail in relation to FIG. 3b.

FIG. 2c illustrates yet another embodiment of the light converting device 200. The light converting device depicted in FIG. 2c is adapted to provide a cold white colour temperature but wherein a third group of light sources 116 having a phosphor 208" is provided, or powered, with electrical current from the electrical drive current $I_{WW}$ of the second group of light sources 110. Hence, the first set 204' of internal electrical wiring provides for a connection between the third group of light sources 116 and the second group of light sources 110, such that they together are electrically driven by the electrical drive current $I_{WW}$ of the second group of light sources 110. The second set 205' of internal electrical wiring is hence connected to the first group of light sources 102 such that the electrical drive current $I_{CW}$ is only provided to the first group of light sources 102, i.e. the second set 205' of internal electrical wiring closes the electrical circuit of the first group of light sources 102. In a similar manner, the embodiment of the light converting device depicted in FIG. 2d is adapted to provide a warm white colour temperature but wherein a third group of light sources 116 having a phosphor 208''' is provided with electrical current from the electrical drive current $I_{CW}$ of the first group of light sources 102. Hence, the first set 204 of internal electrical wiring provides for a connection between the third group of light sources 116 and the first group of light sources 102, such that they together are electrically driven by the electrical drive current $I_{CW}$ of the first group of light sources 102. The second set 205 of internal electrical wiring is hence connected to the second group of light sources 110 such that the electrical drive current $I_{WW}$ is only provided to the second group of light sources 110, i.e. the second set 205 of internal electrical wiring closes the electrical circuit of the second group of light sources 110. The embodiment of the light converting devices 200 illustrated in FIGS. 2c-2d will be described in more detail in relation to the description of FIG. 3c.

Figure 3B:
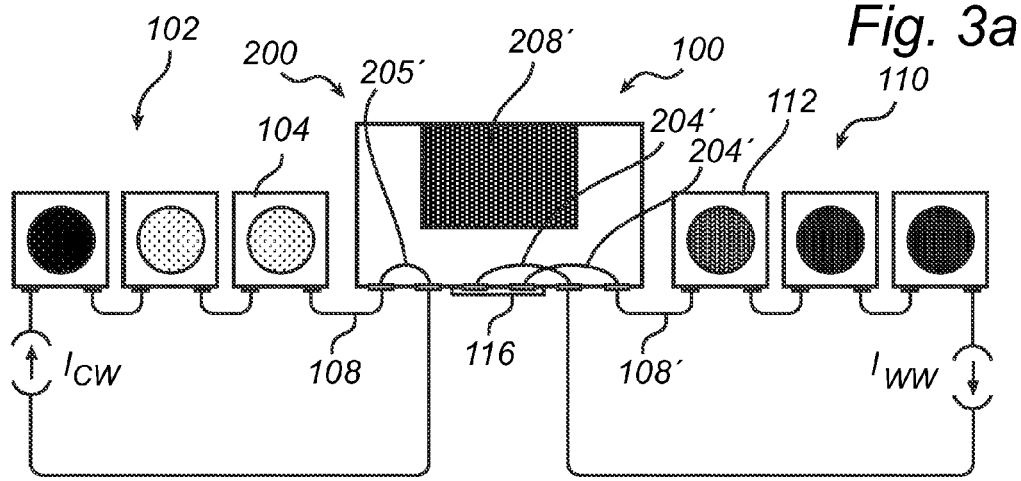
Figure 3C:
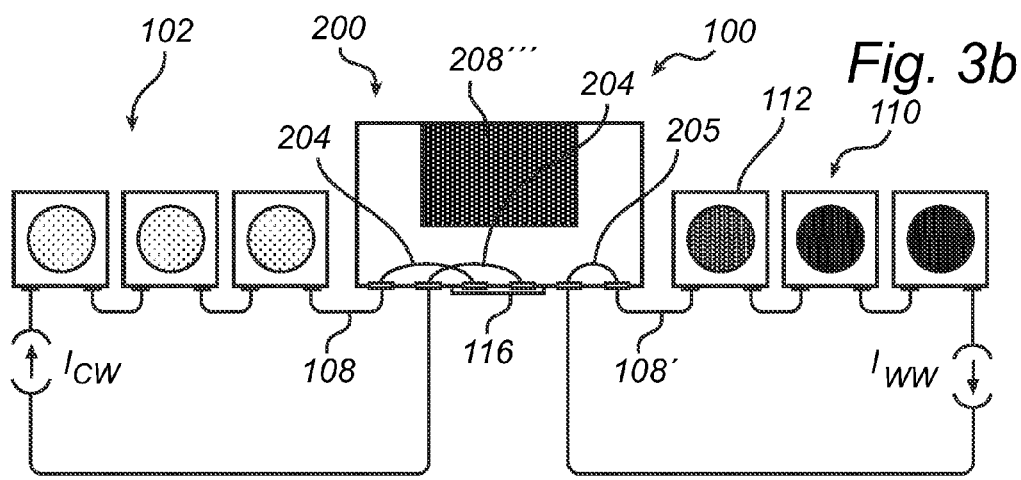

In order to describe the functionality of the lighting arrangement in more detail, attention is drawn to FIGS. 3a-3c illustrating three different example embodiments of the lighting arrangement according to the present invention. Starting with FIG. 3a, the light converting device 200 is the one illustrated in FIG. 2a. The configuration depicted in FIG. 3a is, for example, intended for use when e.g. the first group of light sources 102 provides a white colour temperature which is slightly warmer than desired. The light converting device 200 is connected to the third group of light sources 116. This can be achieved by e.g. pressing, inserting or soldering the light converting device 200 to the third group of light sources. Other ways of carrying out the connection between the light converting device 200 and the third group of light sources 116 are of course conceivable. Moreover, the electrical connection means 120 (see FIG. 1) of the third group of light sources 116 is electrically connected to the first set 204 of internal electrical wiring, which in turn are electrically connected to the electrical drive current $I_{CW}$ of the first group of light sources 102. Hereby, the electrical drive current $I_{CW}$ of the first group of light sources 102 is supplied to the first 102 and the third 116 groups of light sources. Moreover, the second set 205 of internal electrical wiring closes the electrical circuit of the second group of light sources 110. Accordingly, if the white colour temperature of the first group of light sources 102 provides a white colour temperature which is slightly warmer than desired, the light converting device 200 as illustrated in the configuration of FIG. 3a may thus compensate, in conjunction with the third group of light sources 116, for the slightly warmer colour temperature by providing a slightly colder colour temperature. Accordingly, in this case the phosphor 208 of the light converting device 200 is selected such that the third colour temperature is colder (i.e. higher Kelvin) than the first colour temperature.

Turning to FIG. 3b, the illustrated light converting device 200 is the one depicted in FIG. 2b. The configuration depicted in FIG. 3b is, for example, intended for use when e.g. the second group of light sources 110 provides a white colour temperature which is slightly colder than desired. The light converting device 200 is connected to the third group of light sources in the same manner as described above in relation to FIG. 3a. The main difference between the lighting arrangements 100 of FIG. 3a and FIG. 3b is that in FIG. 3b, the electrical connection means 120 of the third group of light sources 116 is configured such that it is electrically connected to the first set 104' of internal electrical wiring, which in turn is electrically connected to the electrical drive current $I_{WW}$ of the second group of light sources 110. Hereby, the electrical drive current $I_{WW}$ of the second group of light sources 110 is supplied to the second 110 and the third 116 groups of light sources. Moreover, the second set 205' of internal electrical wiring closes the electrical circuit of the first group of light sources 102. Accordingly, if the total white colour temperature of the second group of light sources 110 provides a white colour temperature which is slightly colder than desired, the light converting device 200 as illustrated in the configuration of FIG. 3b may thus compensate, in conjunction with the third group of light sources 116, for the slightly colder colour temperature by providing a slightly warmer colour temperature, i.e. the third group of light sources 116 in conjunction with the second group of light sources 110 provides for an increased amount of warm white light. Accordingly, in this case the phosphor 208' of the light converting device 200 is selected such that the third colour temperature is warmer (i.e. lower Kelvin) than the second colour temperature.

Another embodiment of the lighting arrangement is illustrated in FIG. 3c, which comprises the light converting device illustrated in FIG. 2d. The configuration depicted in FIG. 3c is, for example, intended for use when e.g. the first group of light sources 110 provides a white colour temperature which is slightly colder than desired. Moreover, the electrical connection means 120 of the third group of light sources 116 is electrically connected to the first set 204 of internal electrical wiring, which in turn is electrically connected to the electrical drive current $I_{CW}$ of the first group of light sources 102. Hereby, the electrical drive current $I_{CW}$ of the first group of light sources 102 is supplied to the first 102 and the third 116 groups of light sources. Moreover, the second set 205 of internal electrical wiring closes the electrical circuit of the second group of light sources 110. Accordingly, if the white colour temperature of the first group of light sources 102 provides a white colour temperature which is slightly colder than desired, the light converting device 200 as illustrated in the configuration of FIG. 3c may thus compensate, in conjunction with the appropriate selection of phosphor 208''' of the third group of light sources 116, for the slightly colder colour temperature by providing a slightly warmer colour temperature.

Figure 4:
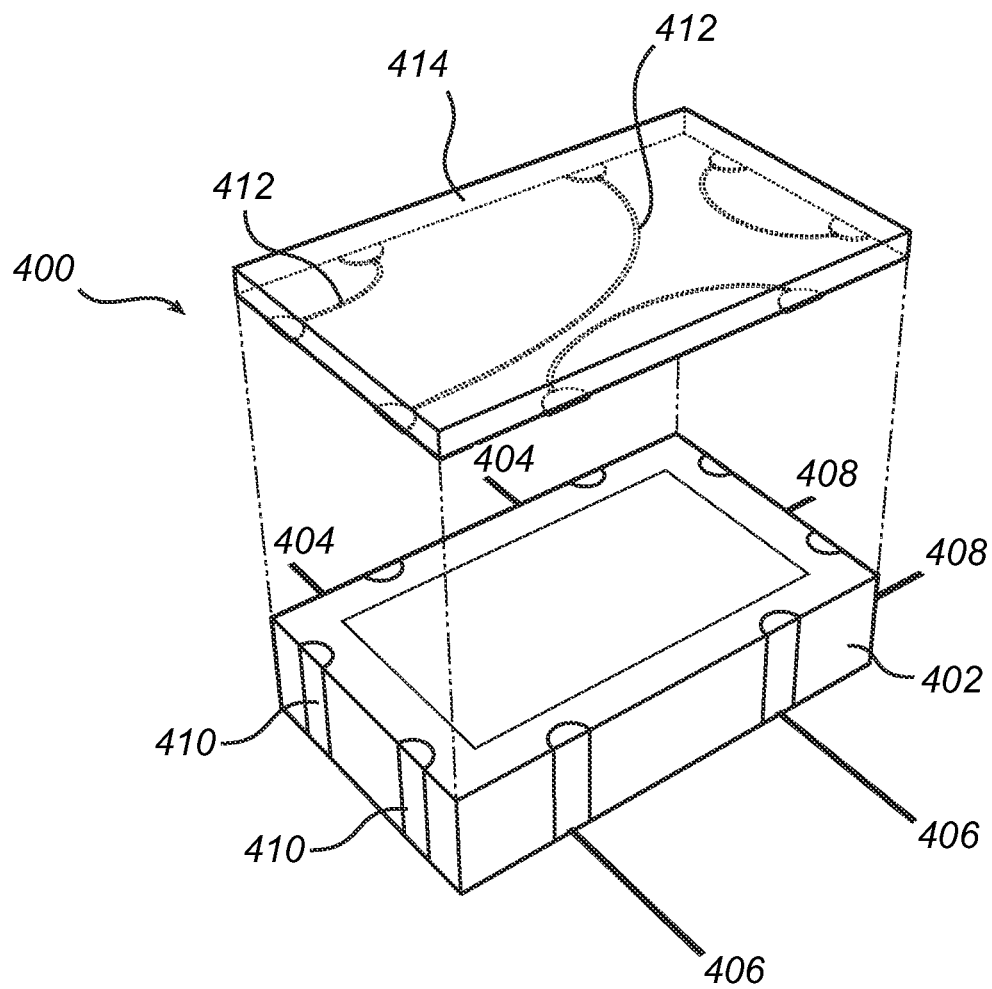
FIG. 4 illustrates an alternative configuration of the light converting device connected to a lighting arrangement according to the present invention.

Referring now to FIG. 4, illustrating an alternative configuration of a light converting device 400 connected to a lighting arrangement 100 according to the present invention. The light converting device 400 comprises LED package 402 comprising the above described third group of light sources, or being one of the LEDs from the third group of light sources. The LED package is provided with contacts for the electrical drive channels 404, 406, 408, where the first drive channel 404 is electrically connected to the first group of light sources, the second drive channel 406 is electrically connected to the second group of light sources, and the third drive channel is electrically connected to a fourth group of light sources. The fourth group of light source comprises at least one LED arranged to provide white light having a fourth colour temperature. Hereby, the light converting device 400 may hence be electrically connected to more light sources than the above described light converting device depicted in relation to e.g. FIGS. 3a-3c. Moreover, in the illustrated embodiment of FIG. 4, the third group of light sources is electrically connected via an electrical input interface 410, such as e.g. an electrical terminal to an electrical power source (not shown here) for supplying power to the LED package 402. The LED package 402 is further connected to the first group of light sources via internal electrical wiring 412 arranged in a phosphor cap 414 provided onto the LED package 402 and via the first drive channel 404. Furthermore, the second 406 and third 408 electrical drive channels closes the electrical circuits of the second and fourth group of light sources, respectively. Accordingly, the light converting device 400 as illustrated in FIG. 4 may contribute to the total light outputted from the lighting arrangement by connecting the electrical input interface 410 to the first drive channel 404, i.e. to the first group of light source, via the internal electrical wiring 412 arranged in the phosphor cap 414. The internal electrical wiring 412 may of course also be connected to one of the second or fourth group of light sources, via the respective second 416 or third 408 drive channels, instead of the above described first group of light sources. It should also be noted that the internal electrical wiring 412 may be positioned to other locations than the depicted phosphor cap 414 in FIG. 4 such that the internal electrical wiring 412 provides less impact to the emitted light from the LED package 402.

An advantage of the embodiment depicted in FIG. 4 is, at least, that the size of the light converting device can be reduced, since the internal electrical wiring 412 is provided within the phosphor cap 414. Other advantages are similar to those described above in relation to e.g. FIGS. 3a-3c.

Furthermore, the above described exemplary embodiments of the lighting arrangement may also be provided with coding criteria. Hereby, the light converting device may be configured with electrical connecting elements which may controllably and electrically connect the light converting device to either one of the first, second or, for the example embodiment depicted in FIG. 4, the fourth group of light sources. This may be achieved by e.g. providing a shape and position of the electrical connecting means 206 of the third group of light sources 116, such that the orientation of the light converting device 200 selects which one of the first, second or fourth group of light sources will be in electrical connection with the third group of light sources.

Although the embodiment depicted in FIG. 4 is illustrated for connection to three groups of light sources by means of the first 404, the second 406 and the third 408 drive channels, the skilled addressee naturally realize that the light converting device 400 may just as well be utilized for e.g. the lighting arrangement 100 depicted in FIG. 1.

Even though the invention has been described with reference to specific exemplifying embodiments thereof, many different alterations, modifications and the like will become apparent for those skilled in the art. Variations to the disclosed embodiments can be understood and effected by the skilled addressee in practicing the claimed invention, from a study of the drawings, the disclosure, and the appended claims. For example, the light converting device may be connected to even further group of light sources, i.e. the above described example embodiment having a first, a second and a fourth group of light sources connected to the light converting device should not be construed as limiting the scope of the present invention. Furthermore, in the claims, the word "comprising" does not exclude other elements or steps, and the indefinite article "a" or "an" does not exclude a plurality.

The invention claimed is:

1. A lighting arrangement, comprising:
   a first group of light sources comprising at least one LED providing white light having a first color temperature;
   a second group of light sources comprising at least one LED providing white light having a second color temperature, wherein the second group of light sources is electrically distinct from the first group of light sources;
   a third group of light sources comprising at least one LED providing a light having a predetermined dominant wavelength, wherein the third group of light sources is electrically connected to the first group of light sources; and
   a light converting device layer positioned on top of the third group of light sources and comprising a phosphor and a phosphor holder, wherein the light converting device layer is configured to convert light from the third group of light sources to white light having a third color temperature, and wherein the phosphor holder of the light converting device layer comprises electrical connection means for providing the electrical connection between the first group of light sources and the third group of light sources.

2. The lighting arrangement according to claim 1, wherein the predetermined dominant wavelength is between 440 nm and 460 nm.

3. The lighting arrangement according to claim 1, wherein the first and the second group of light sources comprises a plurality of LED modules.

4. The lighting arrangement according to claim 1, further comprising a fourth group of light sources comprising at least one LED providing white light having a fourth color temperature.

5. The lighting arrangement according to claim 1, wherein the first color temperature is a cold white color temperature and the second color temperature is a warm white color temperature.

6. The lighting arrangement according to claim 1, wherein the light converting device is provided to the third group of light sources by means of pressing soldering or gluing.

7. An LED module, comprising:
a lighting arrangement according to claim 1, and
a light mixing device configured to receive light from the lighting arrangement and to provide a mixed light output.

8. An LED module according to claim 7, further comprising a control unit for controlling the operation of the first and/or the second group of light sources.

9. The lighting arrangement according to claim 1, wherein the light converting device further comprises a first set of internal electrical wiring and a second set of internal electrical wiring.

10. The lighting arrangement according to claim 5, wherein the cold white color temperature has a color temperature in the range of 3500 Kelvin to 7000 Kelvin and the warm white color temperature has a color temperature in the range of 1800 Kelvin to 3500 Kelvin.

* * * * *